US012451320B2

(12) United States Patent
Salançon et al.

(10) Patent No.: US 12,451,320 B2
(45) Date of Patent: Oct. 21, 2025

(54) GAS ION GUN

(71) Applicants: CENTRE NATIONAL DE LA RECHERCHE SCIENTIFIQUE, Paris (FR); UNIVERSITE D'AIX-MARSEILLE, Marseilles (FR)

(72) Inventors: Evelyne Salançon, Marseilles (FR); Alain Degiovanni, Marseilles (FR); Laurent Lapena, Marseilles (FR); Roger Morin, Marseilles (FR)

(73) Assignees: CENTRE NATIONAL DE LA RECHERCHE SCIENTIFIQUE, Paris (FR); UNIVERSITE D'AIX-MARSEILLE, Marseilles (FR)

( * ) Notice: Subject to any disclaimer, the term of this patent is extended or adjusted under 35 U.S.C. 154(b) by 331 days.

(21) Appl. No.: 18/007,458

(22) PCT Filed: Jul. 16, 2021

(86) PCT No.: PCT/EP2021/070061

§ 371 (c)(1),
(2) Date: Jan. 30, 2023

(87) PCT Pub. No.: WO2022/023094

PCT Pub. Date: Feb. 3, 2022

(65) Prior Publication Data

US 2023/0307204 A1 Sep. 28, 2023

(30) Foreign Application Priority Data

Jul. 31, 2020 (EP) .................................... 20188870

(51) Int. Cl.
*H01J 37/08* (2006.01)

(52) U.S. Cl.
CPC ....... *H01J 37/08* (2013.01); *H01J 2237/0807* (2013.01)

(58) Field of Classification Search
CPC .......... H01J 37/08; H01J 37/073; H01J 37/28; H01J 2237/31749; H01J 2237/0807;
(Continued)

(56) References Cited

U.S. PATENT DOCUMENTS

2008/0174225 A1 7/2008 Tessner et al.
2009/0289185 A1 11/2009 Frosien et al.
(Continued)

FOREIGN PATENT DOCUMENTS

JP S60-180048 A 9/1985
JP S64 24340 A * 1/1989
WO 2011/124617 A1 10/2011

OTHER PUBLICATIONS

Descoins "Microscopie ionique à projection à partir d'une source à structure coaxiale" Physique [physics], Université Paul Cézanne—Aix-Marseille III, (2007) 116 pages (with additional 116 pages of English Machine Translation).
(Continued)

*Primary Examiner* — Wyatt A Stoffa
*Assistant Examiner* — Hsien C Tsai
(74) *Attorney, Agent, or Firm* — TraskBritt

(57) ABSTRACT

A gas ion gun includes an anode electrode to remove electrons from a gas in order to create gas ions. The anode electrode includes a wire made of an electrical conductive material or of a semiconductor material, the wire extending along a longitudinal axis from a proximal end to a flattened distal end. The anode electrode further includes a crystal particle directly deposited on the flattened distal end, the electrical conductivity of the crystal particle being ten times smaller than the electrical conductivity of the wire.

11 Claims, 1 Drawing Sheet

(58) Field of Classification Search
CPC ... H01J 2237/30426; H01J 2237/30446; H01J 2237/2817; H01J 2237/2816; H01J 2237/004
See application file for complete search history.

(56) References Cited

U.S. PATENT DOCUMENTS

| | | | |
|---|---|---|---|
| 2010/0006447 A1 | 1/2010 | Winkler et al. |
| 2013/0119252 A1 | 5/2013 | Kawanami et al. |
| 2013/0248483 A1 | 9/2013 | Sugiyama et al. |
| 2015/0047079 A1 | 2/2015 | Kozakai et al. |

OTHER PUBLICATIONS

European Search Report for European Application No. 20188870.8, dated Dec. 18, 2020, 2 pages.
Hammadi et al. "Proton and light ion nanobeams from field ionization of water" Appl. Phys. Lett. 101, 243110 (2012) 5 pages.
International Search Report for International Application No. PCT/EP2021/070061, mailed Oct. 28, 2021, 3 pages.
International Written Opinion for International Application No. PCT/EP2021/070061, mailed Oct. 28, 2021, 5 pages.
Salançon et al. "A low-energy electron point-source projection microscope not using a sharp metal tip performs well in long-range imaging" Ultramicroscopy 200, Elsevier (Feb. 2019) pp. 125-131, https://doi.org/10.1016/j.ultramic.2019.02.022.
Salançon et al. "A new approach to gas field ion sources", Ultramicroscopy 95, pp. 183-188, 2003.
Salançon et al. "High spatial resolution detection of low-energy electrons using an event-counting method, application to point projection microscopy" Review of Scientific Instruments, American Institute of Physics, 2018, 89(4) 10 pages.
Salançon et al. "Single mineral particle makes an electron point source" Journal of Vacuum Science & Technology B: Microelectronics And Nanometer Structures, vol. 33, No. 3, Mar. 27, 2015 (Mar. 27, 2015), p. 030601-1 to 030601-5.

* cited by examiner

GAS ION GUN

CROSS-REFERENCE TO RELATED APPLICATIONS

This application is a national phase entry under 35 U.S.C. § 371 of International Patent Application PCT/EP2021/070061, filed Jul. 16, 2021, designating the United States of America and published as International Patent Publication WO 2022/023094 A1 on Feb. 3, 2022, which claims the benefit under Article 8 of the Patent Cooperation Treaty to European Patent Application Serial No. 20188870.8, filed Jul. 31, 2020.

TECHNICAL FIELD

The disclosure relates to a gas ion gun.

BACKGROUND

Gas ion guns are also known as GFIS (Gas Field Ion Source). There exist many applications for such guns. For example, they are used in local abrasion devices or local deposition devices. They are also used for chemical analysis of a sample where the sample is first bombarded by gas ions using a focused ion beam (FIB).

For example, a gas ion gun is disclosed in the following article: E. Salançon et al., "*A new approach to gas field ion sources*," Ultramicroscopy 95, pages 183-188, 2003.

Gas ion guns should not be confused with electron field emission sources. Electron field emission sources emit electrons that are extracted from a metal electrode. In gas ion gun, on the contrary, the electrode is used to remove electrons from gas atoms or gas molecules and to absorb the removed electrons. In addition, the electrical field necessary to ionize a gas is much higher than the one used to extract electrons. Typically, the electrical field necessary to remove electrons from gas is greater than 10 V/nm. This value should be compared to the 1 V/nm habitually used to extract electrons in conventional electron field emission sources. Finally, the electrode of electron field emission sources is placed in a chamber, the pressure of which is as low as possible. On the opposite, the electrode of gas ion guns is placed in a chamber where the pressure is much higher because this chamber must contain the gas to be ionized. Due to those differences, teaching given for electron field emission sources is not transposable to gas ion guns without further investigation.

BRIEF SUMMARY

An improved gas ion gun is disclosed herein. One subject of the disclosure is, therefore, a gas ion gun.

BRIEF DESCRIPTION OF THE DRAWINGS

The disclosure will be better understood on reading the following description, provided solely by way of non-limiting example, and with reference to the drawings, in which.

DETAILED DESCRIPTION

In the following description, embodiment examples are first described with reference to the figures in a chapter I. Subsequently, other possible alternative embodiments are presented in a chapter II. Finally, the advantages of the disclosed embodiments are discussed in a chapter III.

Chapter I: Embodiment Examples

Figure 1:
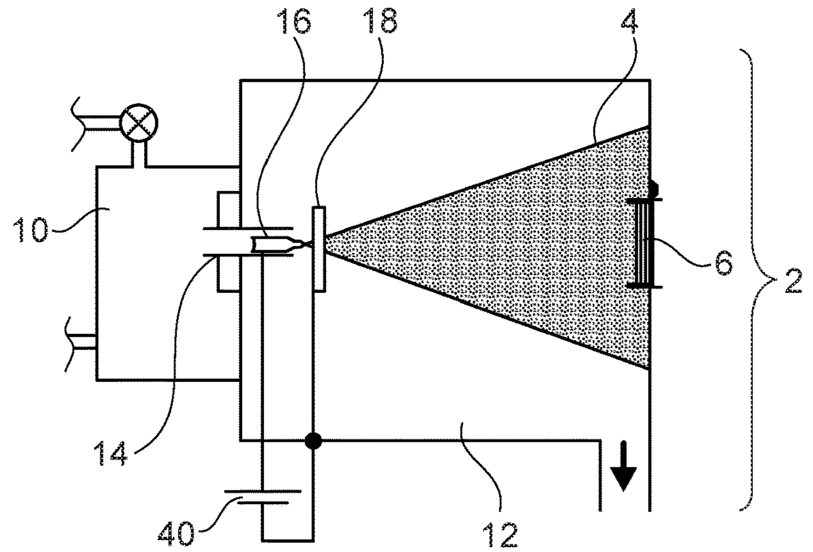
FIG. 1 is a schematic illustration of a gas ion gun.

FIG. 1 shows a gas field ion gun 2. Gun 2 generates beam 4 of gas ions that irradiates a target 6. Target 6 may be any object to be irradiated with gas ions.

The structure and the method to use this gas field ion gun is very similar to the structure of the gas field ion gun disclosed in the following article: E. Salancon et al., "*A new approach to gas field ion sources*," Ultramicroscopy 95, pages 183-188, 2003. Accordingly, only the differences between gun 2 and this known gas field ion gun are described in detail here-below.

Gun 2 comprises:

a rough pressure chamber 10, a low pressure chamber 12, a tube 14 that fluidly connects chamber 10 to chamber 12, an anode electrode 16 mainly received inside tube 14, and a cathode 18.

Chamber 10 comprises the gas to be ionized. The gas may be any gas that can be ionized like hydrogen, helium, neon or similar. The pressure of the gas in chamber 10 is typically greater than $10^{-2}$ mbar ($10^{-3}$ kPa). Usually, the pressure in chamber 10 is smaller than 1 bar (100 kPa).

Beam 4 is created in chamber 12 and then propagates in chamber 12 till target 6. In this embodiment, chamber 12 is designed to limit the number of collision between created gas ions and other particles before reaching target 6. Thus, the pressure in chamber 12 is much lower than in chamber 10. For example, the pressure in chamber 12 is $10^4$ or $10^6$ times lower than in chamber 10. Accordingly, the pressure in chamber 12 is usually between $10^{-6}$ mbar ($10^{-7}$ kPa) and $10^{-2}$ mbar ($10^{-3}$ kPa).

Tube 14 is used to introduce the gas from chamber 10 into chamber 12. For this reason, it has one extremity housed within chamber 10 and its opposite extremity housed within chamber 12. Tube 14 is the only fluid connection between chambers 10 and 12. Tube 14 is an allow tube.

Tube 14 is made of a hollow insulating part and of a hollow conductive part. The insulating part is housed within chamber 10. For example, the insulating part is made of ceramic. The conductive part is received within chamber 12. The conductive part is fluidly connected to the insulating part through a conductive sleeve. Electrode 16 is only received inside the conductive part of tube 14. To this end, the internal diameter of the conductive part of tube 14 is greater than the diameter of electrode 16. For example, the conductive part is made of stainless steel.

The gas flow between chambers 10 and 12 depends on the internal diameter of the conductive part of tube 14 and of the diameter of electrode 16.

For example, once electrode 16 is housed inside tube 14, the distance between the outer surface of electrode 16 and the internal surface of the conductive part of tube 14 is smaller than 50 μm. Here, the internal diameter of the conductive part of tube 14 is equal to 150 μm.

For example, in this embodiment, a pump sucks the gas in chamber 12 at a predetermined and constant speed. In such a situation, the flow of gas between chambers 10 and 12 can be set by adjusting the gas pressure in chamber 10.

Only a tip of electrode 16 emerges from the distal extremity of tube 14 so that the tip of electrode 16 directly faces cathode 18. The part of electrode 16 housed within tube 14 is electrically connected to a positive terminal of a voltage supply 40. For example, electrode 16 is connected to voltage supply 40 by a wire that goes through the connecting sleeve between the insulating and conductive parts of tube 14.

Cathode 18 is electrically biased versus electrode 16 to create an electrical field between the tip of electrode 16 and cathode 18 able to ionize the gas injected into chamber 12 through tube 14. To this end, cathode 18 is electrically connected to a negative terminal of voltage supply 40.

Cathode 18 can be crossed by the generated gas ions. To this end, it comprises at least one aperture in front of the tip of electrode 16. In this embodiment, cathode 18 is a grid known as an "extracting grid."

The distance between the tip of electrode 16 and cathode 18 is smaller than 1 mm. However, this distance should not be too small in order to avoid crashing the tip of electrode 16 into cathode 18. Therefore, usually, this distance is greater than 1 μm.

Voltage supply 40 creates a potential difference between electrode 16 and cathode 18. The generated potential difference is such that the magnitude of the electric field at the tip of electrode 16 is high enough to ionize the gas. Typically, at the tip of electrode 16 the magnitude of the electrical field is greater than 5 V/nm. Here, the difference of potentials between the positive terminal and the negative terminal of voltage supply 40 is such that the magnitude of the electrical field is greater than 10 V/nm at the tip of electrode 16.

Note that, due to the fact that electrode 16 is housed in tube 14, the gas is injected in chamber 12 at an emplacement very close to the tip of electrode 16. It creates a local pressure of gas at the emplacement of the tip of electrode 16 that is greater than the average pressure in chamber 12. Accordingly, gun 2 is able to work with a local pressure in the vicinity of the electrode tip that is much higher than the pressure encountered in other gas ion guns having a different configuration. This makes gun 2 easier to manufacture and more efficient.

Figure 2:
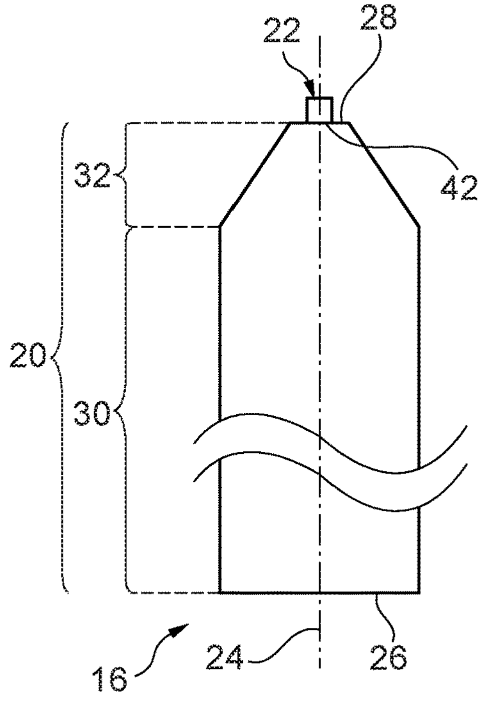
FIG. 2 is an enlarged and schematic view of an electrode used in the gas ion gun of FIG. 1.

As shown in FIG. 2, electrode 16 comprises a wire 20 and a crystal particle 22.

Wire 20 catches the electrons that are removed from the gas. To this end, typically, wire 20 is made of a material, the work function of which is smaller than 6 eV or 5 eV. In this embodiment, wire 20 is made of an electrically conductive material. In this text, an electrically conductive material is a material having an electrical conductivity at 20° C. greater than $10^6$ S/m or $10^7$ S/m.

Here, wire 20 is made of a metallic core. For example, the metallic core is made of polycrystalline Tungsten (W). In addition, the whole metallic core of wire 20 or at least the tip of wire 20 is coated with a noble metal in order to improve the resistance of wire 20 to chemical reactions that lead to corrosion. Here the tip is coated with a thin layer of Palladium (Pd). For example, the thickness of this coating is smaller than 1 μm.

Wire 20 extends, along a longitudinal axis 24, from a proximal end 26 to a flattened distal end 28. From the proximal end 26 to the flattened distal end 28, it successively comprises a main cylindrical part 30 in direct mechanical connection with a truncated cone 32. The wavy lines in FIG. 2 indicate that a portion of cylindrical part 30 has not been shown.

Here, the cross section of cylindrical part 30 is a circle of constant diameter. The diameter $D_{30}$ of part 30 is small, that is smaller than 500 μm. Generally, diameter $D_{30}$ is also greater than 5 μm. In this embodiment, the diameter $D_{30}$ is equal to 125 μm. All the cylindrical part 30 or most of the cylindrical part 30 is housed within tube 14.

Part 30 is directly electrically connected to the first positive terminal of the voltage supply 40.

Flattened distal end 28 is the extremity surface of wire 20. Flattened distal end 28 mainly extends in a plan perpendicular to axis 24. In this embodiment, flattened distal end 28 is essentially circular.

Truncated cone 32 smoothly reduces the diameter of wire 20 from diameter $D_{30}$ to a diameter $D_{28}$. Diameter $D_{28}$ is the diameter of the flattened distal end 28. Diameter $D_{28}$ is two or three times smaller than diameter $D_{30}$ and, preferably, ten times smaller than diameter $D_{30}$. Diameter $D_{28}$ is also not too small in order to accommodate crystal particle 22. Typically, diameter $D_{28}$ is greater than 500 nm. Here, diameter $D_{28}$ is equal to 10 μm.

The height of truncated cone 32 is greater than $D_{30}/2$. Accordingly, here, the height of truncated cone 32 is greater than 62.5 μm. Most of the time, the height of truncated cone 32 is smaller than $10D_{30}$.

Such a wire 20 can be manufactured by electrolytic etching or electrolysis etching process like the one disclosed in WO2011124617A1.

Wire 20 is fixed inside tube 14 such that only truncated cone 32 emerges outside the distal extremity of tube 14. Preferably, only truncated cone 32 extends outside tube 14.

Crystal particle 22 is directly deposited on flattened distal end 28. Particle 22 has a lower face 42 directly in mechanical contact with flattened distal end 28.

Preferably, crystal particle 22 is close to axis 24. In practice, the orthogonal projection of crystal particle 22 on a plan perpendicular to axis 24 is entirely included within the orthogonal projection of the flattened distal end 28 on the same plan.

The relative permittivity of crystal particle 22 is greater than one, preferably, can be greater than five. Here, "relative permittivity" refers to the static relative permittivity. In this example, the crystal particle is a diamond having a relative permittivity greater or equal to eight.

Accordingly, the crystal particle is an insulating material, the electrical conductivity of which is very low. Typically, the electrical conductivity of crystal particle 22 is lower than $10^{-11}$ S/m at 20° C.

The size of crystal particle 22 is very small. Here, it means that the length $L_{22}$ and the width $W_{22}$ of the crystal particle 22 are smaller than 100 nm. The length $L_{22}$ and width $W_{22}$ are also greater than 5 nm. The height $H_{22}$ of the crystal particle is smaller than 40 nm. Height $H_{22}$ is also generally greater than 1 nm. Here, for example, length $L_{22}$, width $W_{22}$ and height $H_{22}$ are equal to, respectively, 50 nm, 50 nm and 10 nm. In most of the case, the crystal particle is not a perfect parallelepiped. Thus, in this text, the length, the width and the height of the crystal particle are equal, respectively, to the length, the width and the height of the smallest parallelepiped that entirely contains the crystal particle. The smallest parallelepiped is the parallelepiped having the smallest volume.

The length and the width of the crystal particle are lying in a plane mainly parallel to the flattened end. Thus, the height of the crystal particle is mainly parallel to the wire axis 24.

There is only one crystal particle 22 on top of flattened distal end 28. To this end, for example, the crystal particle 22 is deposited on flattened distal end 28 using a glass capillary with a tip aperture diameter of 10 μm or less depending on the crystal particles size. More precisely, a crystal's powder is first dispersed under ultra-sound in deionized water. The capillary is filled with the dispersed crystal water. A slight pressure is applied to the wide end of the capillary to form a small drop at the tip aperture. Then, the surface of flattened distal end 28 is immersed in this small drop. When the flattened distal end 28 is pulled out from the small drop, some water with a very limited number of crystal particles remains on the flattened distal end 28. The density of crystal particles 22 in the deionized water is adjusted to obtain at least one crystal particle so deposited on the flattened distal end 28. For example, 1 mg of crystal particles 22 are dispersed in 10 mL of deionized water. Subsequently, a microscope can be used to verify the number of crystal particles 22 deposited on flattened distal end 28. The microscope is, for example, a scanning electron microscope. Here, only the manufactured wires having only one single crystal particle 22 on flattened distal end 28 are selected to be used as electrode 16.

Figure 3:
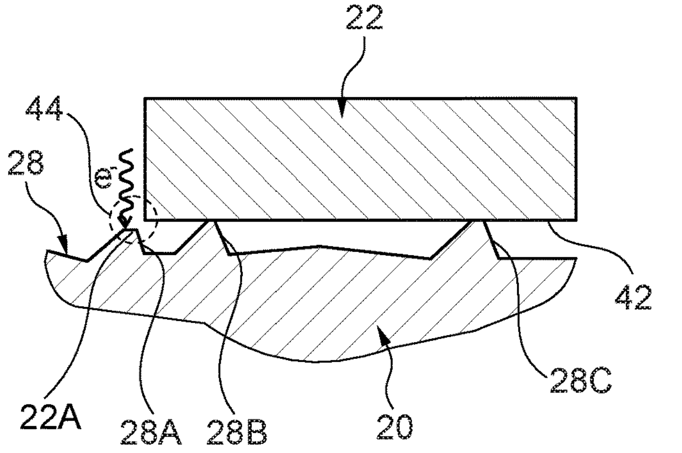
FIG. 3 is an enlarged, partial and schematic view of a crystal particle of the electrode of FIG. 2.

FIG. 3 shows in more detail a portion of crystal particle 22 on top of flattened distal end 28. The roughness of flattened distal end 28 is much higher than the roughness of the lower face 42 of crystal particle 22. Typically, the roughness of flattened distal end 28 is ten times greater than the roughness of lower face 42. For example, roughness of the surface of flattened distal end 28 and lower face 42 can be measured or estimated using the Ra roughness. The low roughness of crystal particle 22 is due to the fact that particle 22 has the structure of a single crystal that is highly ordered and its lattice is continuous and unbroken. On the contrary, wire 20 is made from a non-crystalline material or from a polycrystalline material. Thus, its roughness is much higher than the roughness of a single crystal.

Accordingly, as schematically shown in FIG. 3, flattened distal end 28 comprises picks that extend toward cathode 18.

Lower face 42 of crystal particle 22 rests on the tips of the highest picks situated just underneath. Picks 28B and 28C are illustration of such picks.

Since the size of crystal particle 22 is very small, it is submitted that there also exists only one pick that is:

- not underneath crystal particle 22,
- the tip of which is not in direct contact with crystal particle 22, and
- the tip of which is the closest from the crystal particle 22.

An illustration of such a pick is shown under the number reference 28A in FIG. 3.

Typically, the distance between the tip of pick 28A and the closest edge of crystal particle 22 is as small as a few nanometers. For example, this distance is smaller than 5 nm.

Presently, it is submitted that the highest magnitude of the electrical field lies between pick 28A and the edge of crystal particle 22, which is the closest of the tip of pick 28A. Thus, the ionization of the gas only takes place at this emplacement. In FIG. 3, such an ionization is illustrated by the symbol "$e^-$" and a wavy arrow that points toward the tip of pick 22A and that illustrates the path of electron "$e^-$."

More precisely, the operation of electrode 16 when a potential difference is applied by voltage supply 40 is explained as follows. Subjected to an electrical field and due to the crystal particle 22, the magnitude of the electrical field is exalted in a zone 44 (FIG. 3) of the tip of electrode 16. It is submitted that zone 44 is situated between the tip of pick 28A and a lower edge of crystal particle 22. In zone 44 the magnitude of the electrical field is high enough to trigger the gas ionization. Here, voltage supply 40 is set so that the magnitude of the electrical field between electrode 16 and cathode 18 is such that:

- the magnitude of electrical field in zone 44 is greater than 10 V/nm, and
- the magnitude of the electrical field outside zone 44 is not enough to ionize the gas.

For example, outside zone 44, the electrical field is smaller than 10 V/μm when the potential difference between anode (electrode 16) and cathode 18 is equal or smaller than 5 kV.

Thus, the ionization of the gas only takes place in zone 44. It means that the emitting surface of electrode 16 is very small. Accordingly, electrode 16 has an improved brightness. It is recalled that the "brightness" B of gas ion gun is defined by the following relationship: $B=I/(\Omega S)$, where:

- I is the intensity of the gas ion beam in Ampere,
- Ω is the solid angle of the gas ion beam, and
- S is the surface of the emitting electrode.

In addition, it has been observed that the lifetime of electrode 16 is improved. The improved lifetime of electrode 16 is explained by the fact that pick 28A is at least partially protected by crystal particle 22.

Chapter II: Other Embodiments

Alternative Embodiments of the Electrode:

Other crystal particles than diamond may be used. For example, crystal particles of the following materials can be used: celadonite particle, kaolinite, talc.

What is important is that the electrical conductivity of wire 20 is greater than the electrical conductivity of the crystal particle. Typically, the electrical conductivity of wire 20 is ten times to $10^4$ times greater than the electrical conductivity of the crystal particle. Accordingly, provided that such a condition is satisfied, the crystal particle may also be made from a semiconductor material.

While, in most situations, the crystal particle should be very small, in some other situation, the size of the crystal particle may be chosen bigger. Typically, the length and width of the crystal particle may be as big as 1 μm. The height of the crystal particle may be as big as 100 nm.

For some application, it may be acceptable to have several crystal particles 22 deposited on flattened distal end 28. For example, the number of crystal particles 22 on the flattened distal end 28 is equal or greater than five.

Truncated cone 32 may be omitted. In such a case, there exists an abrupt transition between cylindrical part 30 and flattened distal end 28. For example, the truncated cone is omitted when diameter $D_{30}$ of the conductive wire is small, that is, for example, smaller than 30 μm. Such a conductive wire having a small diameter may be a carbon fiber. For example, the diameter of the carbon fiber is 10 μm or less.

Other conductive materials are possible for wire 20. For example, wire 20 can be made of other metal like tungsten, copper and, preferably, of noble metal like Iridium (Ir) or Palladium (Pd). The coating of the core of the wire may be omitted in the simplest embodiment. The conductive material may also not be a metal. For example, the wire can be a carbon fiber.

Wire 20 is not necessarily made of conductive material. It can also be made of semiconductor material like silicon. In such a case, its electrical conductivity at 20° C. is greater than $10^{-5}$ S/m.

The cross section of cylindrical part 30 may be different from a circle. For example, the cross section can be rectangular. When the cross section of part 30 is not a circle, the diameter of the cross section is defined as being equal to the hydraulic diameter of this cross section.

Similarly, the flattened end is not necessarily a disk surface. It can be rectangular or may have any other appropriate forms. For other forms than a disk, the term "diameter" means "hydraulic diameter."

Other Alternatives:

Other embodiments of the cathode are possible. For example, the cathode can be a conductive plate having a single hole in front of the tip.

It is not mandatory that the gas to be ionized be made only of a single species of gas atoms. The gas to be ionized may also be a mixture of different gas atom species like helium and hydrogen. It can also contain gaseous molecules like water vapor or other gaseous molecules that can be ionized.

Other embodiments of gun 2 are possible. For example, in an alternative embodiment, in addition, electrode 16 is cooled down so that the gas condenses on its tip.

Electrode 16 can be used in another embodiment of a gas ion gun. For example, electrode 16 is placed within a chamber comprising a low pressure of gas. Electrode 16 is cooled down so that the gas condenses on the tip of electrode 16. The condensed gas on the tip of electrode 16 is then ionized. In such an embodiment, chamber 10 is omitted. It is also not mandatory to house electrode 16 in a tube like tube 14.

Chapter III: Advantages

Due to the use of the crystal particle on the flattened distal end of wire 20, the lifetime of the electrode is increased compared to the lifetime of a conventional electrode used in the same conditions.

It has also been observed that gun 2 starts to emit gas ions for a lower potential difference between cathode 18 and electrode 16 than if a conventional electrode was used.

In addition, the brightness of gun 2 is improved in comparison to similar gas ion guns deprived of crystal particle at the end of the conductive wire. This is explained by the fact that there is only a very limited number of picks of flattened distal end 28 that can absorb electrons from the gas.

The applicant is aware of the following article: E. Salancon et al., "*Single mineral particle makes an electron point source*," Journal of Vacuum Science & Technology, B 33, 030601 (2015). This article is referred herein as "Article 2015." Article 2015 discloses an electron field emission source having an electrode that contains a crystal particle. However, as explained in the introduction of the present text, the way of using electrodes in gas ion guns is very different from the way of using electrodes in electron field emission sources. Thus, the skilled man cannot straightforwardly transpose a teaching given in the context of electron field emission sources to gas ion guns. In addition, Article 2015, as well as all the other articles of the same authors, clearly recites that:

- there exists a Fowler-Nordheim regime at low voltage where the beam intensity strongly increases with the potential difference applied, and
- at higher voltage, a saturation regime where the beam intensity increases less strongly with the potential difference.

Accordingly, the electrode disclosed in Article 2015 has only been used in the Fowler-Nordheim regime because the saturation regime is less efficient. For this reason, up to now, the electrode of Article 2015 was deemed to be usable only in electron field emission sources and not in gas ion guns because in a gas ion gun, it is necessary to use electric fields that are ten times greater than the one used in electron field emission sources. In fact, without further knowledge, it could be expected from the prior art publication that the saturation regime would occur when using the electrode of Article 2015 in a gas ion gun because a higher potential difference is required to remove electrons from gas. However, what is revealed in this application, is that such an electrode is also suitable for gas ion guns.

The truncated cone allows the reduction of the solid angle of the ion beam. Thus, the brightness is improved.

Using a crystal, the length and width of which are smaller than 100 nm, produces an electrode comprising a single pick that ionizes the gas. Therefore, the emitting surface of the electrode is reduced and the brightness is improved.

Using a diamond as the crystal deposited on the flattened distal end of the electrode improves the brightness.

Bringing the gas through a tube in which the conductive wire is housed further increases the brightness of the gun.

The invention claimed is:

1. A gas ion gun comprising:

- a main chamber in which is introduced a gas to be ionized,
- an anode electrode to remove electrons from the gas in order to create gas ions, the anode electrode comprising a wire made of an electrical conductive material or of a semiconductor material, the wire extending along a longitudinal axis from a proximal end to a flattened distal end and the flattened distal end being housed inside the main chamber,
- a cathode to create an ionizing electric field which is greater than 10V/nm in a region near the flattened distal end of the wire,
- wherein the anode electrode further comprises a crystal particle directly deposited on the flattened distal end, the electrical conductivity of the crystal particle being ten times smaller than the electrical conductivity of the wire.

2. The gas ion gun according to claim 1, wherein the anode electrode comprises only one single crystal particle directly deposited on the flattened distal end.

3. The gas ion gun according to claim 1, wherein the wire comprises a truncated cone, cross-section of which is decreasing till the flattened distal end.

4. The gas ion gun according to claim 1, wherein:

- the length and the width of the crystal particle are less than 100 nm and the height of the crystal particle is less than 50 nm, the width, the length and the height of the crystal particle being equal to, respectively, the width, the length and the height of the smallest parallelepiped that entirely contains the crystal particle, the smallest parallelepiped meaning the parallelepiped having the smallest volume, and
- the length and the width of the crystal particle being parallel to the flattened end.

5. The gas ion gun according to claim 1, wherein the crystal particle is a diamond.

6. The gas ion gun according to claim 1, wherein the gas ion gun comprises a voltage supply electrically connected to the cathode and the anode electrode, and the potential difference generated by the voltage supply between the cathode and the anode electrode is adapted to have only one single zone between a pick of the flattened end and an edge of the crystal particle in which the gas ionization takes place.

7. The gas ion gun according to claim 1, wherein:

- the gun comprises a tube that extends from a proximal extremity to a distal extremity, most of the wire being housed within this tube and the distal flattened end of which emerges from the distal extremity of the tube,
- a rough pressure chamber configured to contain a high pressure of the gas to be ionized, the tube proximal extremity being placed inside this rough pressure chamber, the tube distal extremity being place inside this main chamber so that the main chamber is only fluidly connected to the rough pressure chamber through the tube, the cathode being housed within the main chamber.

8. The gas ion gun according to claim 1, wherein the wire has a diameter between 5 μm and 500 μm.

9. The gas ion gun according to claim 1, wherein the wire is made of at least one electrically conductive material.

10. The gas ion gun according to claim 1, wherein the crystal particle has an inferior face in contact with the flattened end, and the roughness of the flattened end is at least ten times greater than the roughness of the inferior face.

11. The gas gun according to claim 1, wherein the electrical conductivity of the crystal particle is lower than $10^{-11}$ S/m.

* * * * *